(12) United States Patent
Inazuki et al.

(10) Patent No.: US 11,131,920 B2
(45) Date of Patent: Sep. 28, 2021

(54) PHOTOMASK BLANK, AND METHOD OF MANUFACTURING PHOTOMASK

(71) Applicant: Shin-Etsu Chemical Co., Ltd., Tokyo (JP)

(72) Inventors: Yukio Inazuki, Joetsu (JP); Kouhei Sasamoto, Joetsu (JP); Naoki Matsuhashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 178 days.

(21) Appl. No.: 16/692,491

(22) Filed: Nov. 22, 2019

(65) Prior Publication Data

US 2020/0192215 A1 Jun. 18, 2020

(30) Foreign Application Priority Data

Dec. 12, 2018 (JP) .............................. JP2018-232298

(51) Int. Cl.
*G03F 1/26* (2012.01)
*G03F 1/50* (2012.01)

(52) U.S. Cl.
CPC . *G03F 1/26* (2013.01); *G03F 1/50* (2013.01)

(58) Field of Classification Search
CPC ..................................... G03F 1/26; G03F 1/50
See application file for complete search history.

(56) References Cited

U.S. PATENT DOCUMENTS 7,166,392 B2   1/2007 Ushida et al.

FOREIGN PATENT DOCUMENTS

| JP | 2-264952 A | 10/1990 |
|---|---|---|
| JP | 3093632 U | 2/2003 |
| JP | 2003-195479 A | 7/2003 |
| JP | 2003-195483 A | 7/2003 |
| JP | 2018-106023 A | 7/2018 |
| WO | WO 2007/058199 A1 | 5/2007 |

OTHER PUBLICATIONS

European Search Report for Appl. No. 19211441.1 dated May 12, 2020.

*Primary Examiner* — Christopher G Young
(74) *Attorney, Agent, or Firm* — Birch, Stewart, Kolasch & Birch, LLP

(57) ABSTRACT

A photomask blank for a material of a photomask used in pattern transfer by exposure light having a wavelength of up to 250 nm, including a transparent substrate, a chromium-containing film directly formed on the substrate or formed with an optical film intervened between the transparent substrate and the chromium-containing film. The chromium-containing film includes a region (A) composed of a chromium compound containing chromium, oxygen and carbon, wherein each of contents of the elements contained in the chromium compound is continuously varied in the thickness direction of the region (A), and toward the substrate, the content of chromium increases, and the content of carbon decreases.

10 Claims, 8 Drawing Sheets

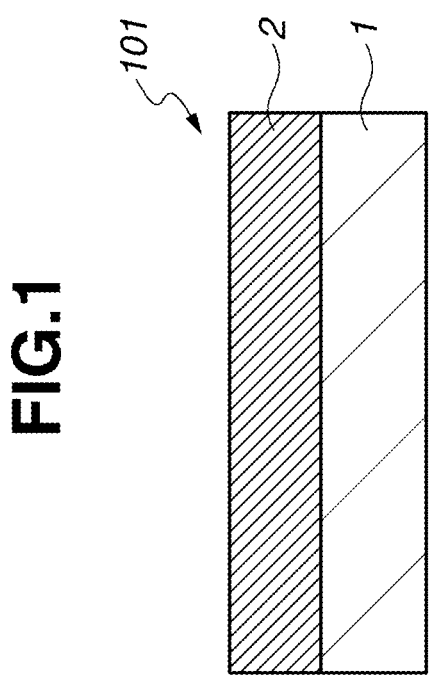

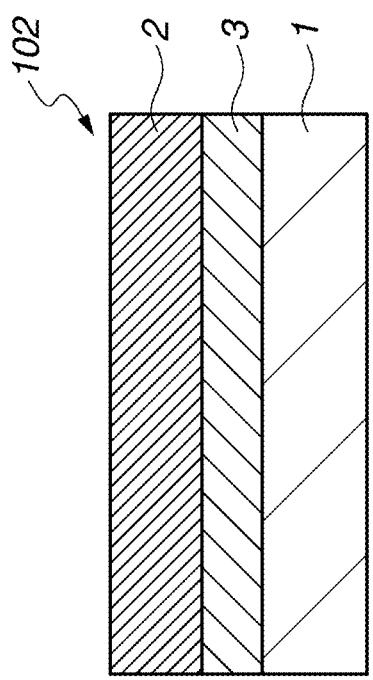

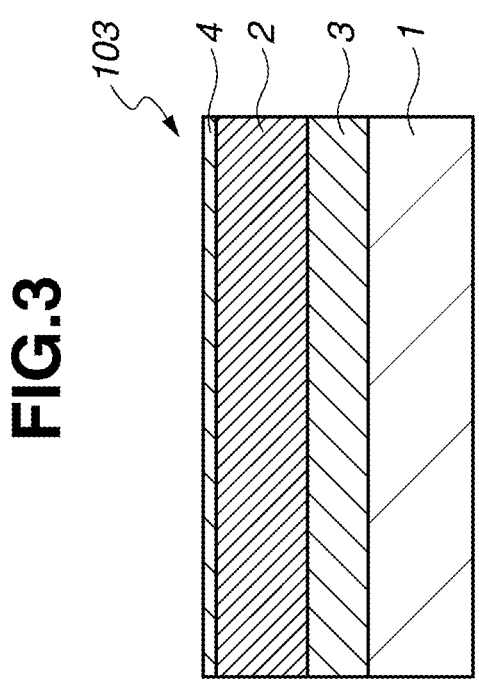

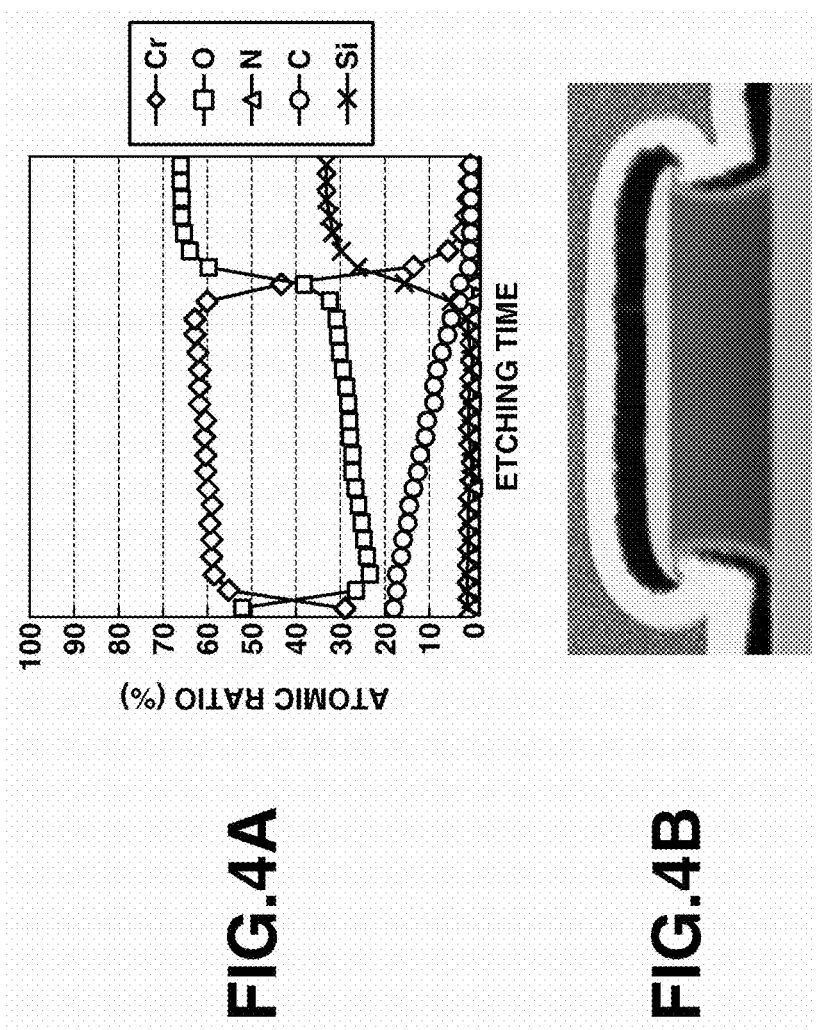

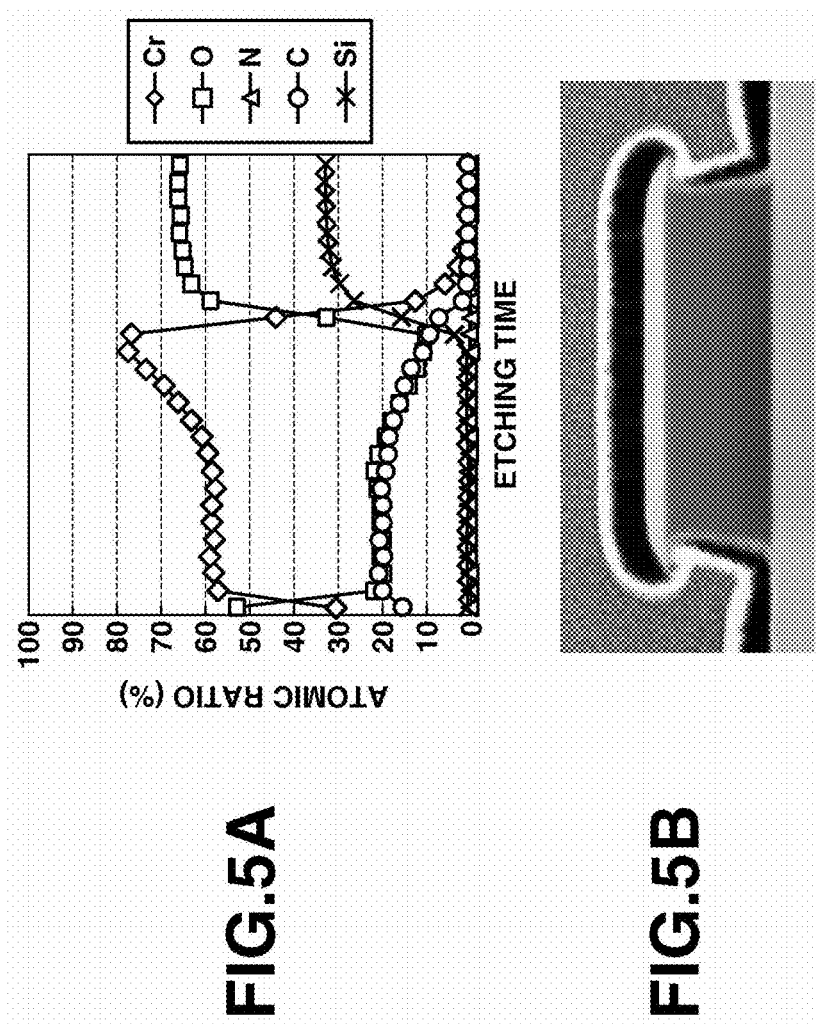

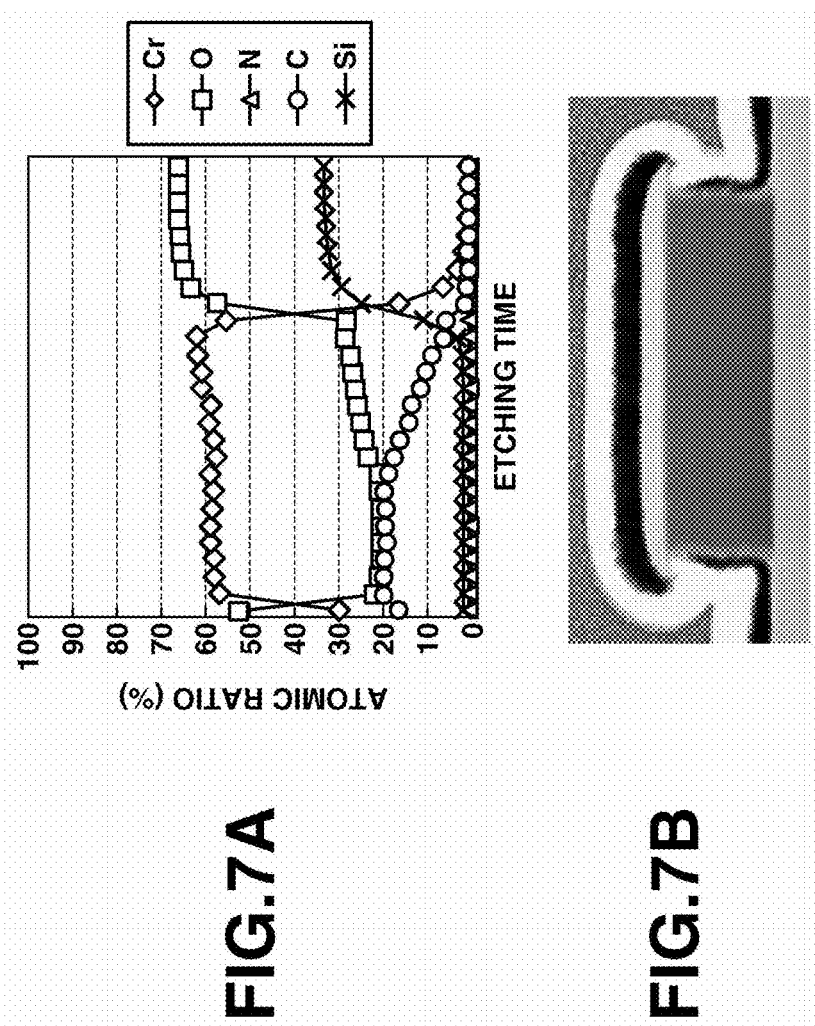

PHOTOMASK BLANK, AND METHOD OF MANUFACTURING PHOTOMASK

CROSS-REFERENCE TO RELATED APPLICATION

This non-provisional application claims priority under 35 U.S.C. § 119(a) on Patent Application No. 2018-232298 filed in Japan on Dec. 12, 2018, the entire contents of which are hereby incorporated by reference.

TECHNICAL FIELD

The present invention relates to a photomask blank which is a material in manufacturing a photomask for use in pattern transfer by exposure light, and a method of manufacturing a photomask using the same.

BACKGROUND ART

High integration of large scale integrated circuits is progressing for high-speed operation and low power consumption of semiconductor electronic devices. In connection with the miniaturization of circuit patterns, advanced semiconductor microfabrication technology has been become an extremely important elemental technology. For example, a finer technique for a wiring pattern constituting a circuit and a miniaturization technique for a contact hole pattern for wiring between layers constituting a cell are essential.

Such an advanced finer processing is performed by photolithography technique using a photomask, and the photomask is an important technology for the miniaturization together with an exposure apparatus and a resist material. Therefore, technological development for forming a finer and more accurate pattern on a photomask blank has been progressed for realizing a photomask having a miniaturized wiring pattern or a miniaturized contact hole pattern.

To form a photomask pattern having high accuracy on a photomask substrate, a resist film which is formed on a photomask blank must be patterned with high accuracy. A pattern size formed on a photomask is about four times of a size of a pattern formed on a semiconductor substrate since a reduction projection method is used for a photolithography in which a semiconductor substrate is finely processed. However, this does not mean that an accuracy of the pattern formed on the photomask is relieved, and similarly, it is required to form the photomask pattern with high accuracy.

Currently, a size of a circuit pattern to be drawn on a semiconductor substrate by photolithography is extremely small compared with a wavelength of exposure light. Thus, even if a reduction projection method is performed by using a photomask having a photomask pattern which is formed a circuit pattern enlarged by 4 times without change, the configuration of the photomask pattern cannot be exactly transferred due to influence such as interaction of exposure light.

For the reason, as a super-resolution mask, an OPC mask corrected optical proximity effect that degrades transferring characteristics by utilizing so-called optical proximity effect correction (OPC), and a phase shift mask that can precipitously change an intensity distribution of incident light by shifting the phase of exposure light transmitted through the pattern by 180° are used. In the OPC mask, for example, an OPC pattern (hammer head, assist bar, and so on) having a size of up to ½ of the circuit pattern is formed. Examples of the phase shift mask include a halftone phase shift mask, a Levenson type phase shift mask, and a chromeless type phase shift mask.

In order to form a mask pattern, generally, a photoresist film is formed on a photomask blank having a light-shielding film on a transparent substrate, a pattern is drawn on the photoresist film by irradiating with electron beam or light, and the photoresist film is developed to obtain a pattern of the photoresist film. Then, the photomask pattern is formed by patterning the light-shielding film by using the pattern of the photoresist film as an etching mask. For the following reasons, it is effective to reduce the thickness of the photoresist film to obtain a fine photomask pattern.

If a pattern of a resist film is simply miniaturized without reducing the thickness of the resist film, the aspect ratio (ratio of the resist film thickness to the pattern width) of the resist portion that functions as an etching mask for the light-shielding film increases. Generally, when the aspect ratio of the resist film pattern is increased, the pattern shape easily deteriorates, and the pattern transfer accuracy to the light-shielding film is reduced. In furtherly aggravated cases, a part of the pattern of the resist film topples or peels off, resulting in pattern omission. Therefore, as the photomask pattern is miniaturized, it is necessary to reduce a film thickness of a resist film used as an etching mask for patterning a light-shielding film so that the aspect ratio does not become too high. Generally, an aspect ratio of up to 3 is required, thus, for example, a resist film having a thickness of up to 210 nm is desired to form a resist film pattern having a width of 70 nm.

On the other hand, when a photomask is used for transferring a photomask pattern to a photoresist film as an object to be transferred on a semiconductor wafer by ArF excimer laser as exposure light, the pattern width is reduced to less than 100 nm for a normal product, and less than 20 nm for an advanced product under current circumstance in which miniaturization of a wiring progresses. A minimum width of a main pattern on the photomask which is compatible with the circumstance is about 100 nm. Moreover, since an OPC is complicated, a width of an auxiliary pattern is further reduced to less than 100 nm (for example, about 70 nm).

Meanwhile, many materials have been proposed for as a material of a light-shielding film which is patterned by using a pattern of a photoresist film as an etching mask. In particular, a film that is composed of single chromium, or a chromium compound containing chromium and at least one of nitrogen, oxygen and carbon, as a general material, is used as a conventional light-shielding film. For example, a construction of a photomask blank in which a light-shielding film having light-shielding characteristics required for a photomask blank for ArF excimer laser exposure is formed of a chromium compound film is shown in Patent documents 1 to 3.

CITATION LIST

Patent Document 1: JP-A 2003-195479
Patent Document 2: JP-A 2003-195483
Patent Document 3: JP-U 3093632

SUMMARY OF THE INVENTION

In order to transfer a fine pattern accurately with high dimensional precision by photolithography using a photomask having a mask pattern of a chromium-containing film, it is important that the pattern of the chromium-containing film has a good cross-sectional shape. Particularly, when the chromium-containing film is a light-shielding film, it is necessary a certain film thickness to ensure an optical density with respect to the exposure light necessary as a light-shielding film, thus, perpendicularity of cross-sectional shape is more important.

A chromium-containing film such as a chromium compound film used for a light-shielding film, and so on is generally patterned by oxygen-containing chlorine-based dry etching. The oxygen-containing chlorine-based dry etching is a highly isotropic. Further, since an etching rate varies on a composition of the chromium compound film, an amount of side etching depends on the composition of the chromium compound film. In particular, since the chromium compound film is etched in the film thickness direction and also in a film surface direction of the chromium-containing film parallel to the substrate surface, side etching of the chromium compound film easily proceeds. For example, in the case of a chromium compound film having a uniform composition in the film thickness direction, as the etching proceeds in the film thickness direction from the surface of the chromium compound film, the etching also proceeds in the film surface direction. Therefore, the cross-sectional shape of the pattern obtained after the etching tends to be a shape constricted near the center of the pattern along the thickness direction or a tapered shape.

For a chromium-containing film as a light-shielding film, a multilayer including an antireflection layer and a light-shielding layer is commonly used. In the chromium-containing film having a multilayered construction, each of the layers is composed of a layer having a different composition and selected from a chromium layer or a chromium compound layer. In these, each of the layers has a different etching rate derived from the compositional difference. Since the degree of etching in film surface direction of the chromium-containing film is different in each layer, side etching amounts of the layers tend to differ each other. When the side etching amounts of the layers differ, the cross-sectional shape of the chromium compound film pattern obtained after the etching becomes discontinuous. In such a case, the pattern width varies in the pattern thickness direction, readily resulting in shape failure. For example, the cross-sectional shape results to, in the vertical cross-sectional shape, a shape having a pattern width that is narrow or wide at the center of the pattern along the thickness direction, or a pattern width that is wide at the top or bottom of the pattern along the thickness direction such as a T-shaped or inverted T-shaped.

For patterning by using a pattern of the chromium-containing film as an etching mask, an underlying film, for example, a film composed of a material containing silicon and free of a transition metal, a film composed of a material containing a transition metal and silicon, or a transparent substrate is patterned, the pattering also has a problem such that dimensional deviation between a designed dimension and a dimension of the etched film or etched substrate becomes large, resulting in deterioration of pattern transferring performance.

Furthermore, in recent years, a new generation technology with further advanced miniaturization is required to form a pattern with a half pitch of up to 20 nm, and further up to 10 nm. In such a half pitch size, the tolerance for dimensional accuracy is about several nanometers or less. Thus, a conventional chromium compound film in which the perpendicularity of the cross-sectional shape cannot be obtained due to the side etching as described above, has a problem that cannot be accomplished dimensional accuracy required for a further miniaturized pattern of a chromium compound film, for example, dimensional uniformity in-plane of a pattern of the chromium compound film.

The present invention has been made to solve the above problems, and an object of the present invention is to provide a photomask blank including a chromium-containing film that accommodates a new generation photolithography technology and can be formed a fine photomask pattern having a good cross-sectional shape with high accuracy. Further, another object of the present invention is to provide a method of manufacturing a photomask by using the photomask blank.

In order to solve the above-mentioned problems, the inventors have been found that a chromium-containing film consisting of:
(i) only a region (A) composed of a chromium compound containing chromium, oxygen and carbon, wherein each of contents of the elements contained in the chromium compound is continuously varied in the thickness direction of the region (A), and toward the substrate, the content of chromium increases, and the content of carbon decreases;
(ii) the region (A), and a region (B) composed of a chromium compound containing chromium, oxygen and carbon, and contiguous to either the substrate side or the side remote from the substrate, wherein each of contents of the elements contained in the chromium compound is constant in the thickness direction of the region (B); or
(iii) the region (A) or the regions (A) and (B), and a region (C) composed of a chromium compound containing chromium, oxygen and carbon, and disposed at the side remotest from the substrate, wherein each of contents of the elements contained in the chromium compound is continuously varied in the thickness direction of the region (C), and toward the substrate, the content of oxygen decreases. The perpendicularity of the cross-sectional shape of a mask pattern after etching of the chromium-containing film is high, and even when a finer photomask pattern is formed, the photomask pattern of the chromium-containing film can be formed with high accuracy.

In one aspect, the invention provides a photomask blank including a photomask blank for a material of a photomask used in pattern transfer by exposure light having a wavelength of up to 250 nm, the photomask blank including a transparent substrate, and a chromium-containing film directly formed on the substrate or formed with an optical film intervened between the transparent substrate and the chromium-containing film, the chromium-containing film being susceptible to oxygen-containing chlorine-based dry etching, wherein the chromium-containing film consists of:
(i) only a region (A) composed of a chromium compound containing chromium, oxygen and carbon, wherein each of contents of the elements contained in the chromium compound is continuously varied in the thickness direction of the region (A), and toward the substrate, the content of chromium increases, and the content of carbon decreases;
(ii) the region (A), and a region (B) composed of a chromium compound containing chromium, oxygen and carbon, and contiguous to either the substrate side or the side remote from the substrate, wherein each of contents of the elements contained in the chromium compound is constant in the thickness direction of the region (B); or
(iii) the region (A) or the regions (A) and (B), and a region (C) composed of a chromium compound containing chromium, oxygen and carbon, and disposed at the side remotest from the substrate, wherein each of contents of the elements contained in the chromium compound is continuously varied in the thickness direction of the region (C), and toward the substrate, the content of oxygen decreases.

Preferably, in the region (A), a difference between the maximum and minimum chromium contents (at %) is at least 3, and in the region (A) or the regions (A) and (B), chromium content is at least 45 at %; or a difference between the maximum and minimum carbon contents (at %) is at least 5.

Preferably, the chromium compound composing the region (A) further contains nitrogen, and toward the substrate, the content of nitrogen increases.

Preferably, the chromium-containing film has a thickness of up to 50 nm.

Preferably, the chromium-containing film has an optical density of at least 1.5 with respect to the exposure light.

In a preferable embodiment, the chromium-containing film is formed with the optical film intervened between the transparent substrate and the chromium-containing film, and the optical film includes a phase shift film composed of a material containing silicon and free of a transition metal, or a material containing a transition metal and silicon, and preferably, the total optical density of the chromium-containing film and the phase shift film is at least 2.5.

In another preferable embodiment, the photomask blank includes a hard mask film disposed on the chromium-containing film and composed of a material containing silicon.

In another aspect, the invention provides a method of manufacturing a photomask including the step of patterning the chromium-containing film of the photomask blank any one of claims 1 to 9 by oxygen-containing chlorine-based dry etching.

Advantageous Effects of the Invention

From the chromium-containing film of the photomask blank of the invention, a good cross-sectional shape can be obtained by oxygen-containing chlorine-based dry etching, thus, a fine photomask pattern can be formed with high accuracy by using the photomask blank of the invention.

BRIEF DESCRIPTION OF THE DRAWINGS

FIG. 1 is a cross-sectional view illustrating an example of a first embodiment of a photomask blank according to the invention.

FIG. 2 is a cross-sectional view illustrating an example of a second embodiment of a photomask blank according to the invention.

FIG. 3 is a cross-sectional view illustrating an example of a third embodiment of a photomask blank according to the invention.

FIG. 4A is a graph showing a compositional distribution in the thickness direction of the chromium-containing film in Example 1, and FIG. 4B is a scanning electron microscope image on the cross-section of the chromium-containing film pattern in Example 1.

FIG. 5A is a graph showing a compositional distribution in the thickness direction of the chromium-containing film in Example 2, and FIG. 5B is a scanning electron microscope image on the cross-section of the chromium-containing film pattern in Example 2.

FIG. 7A is a graph showing a compositional distribution in the thickness direction of the chromium-containing film in Example 4, and FIG. 7B is a scanning electron microscope image on the cross-section of the chromium-containing film pattern in Example 4.

DESCRIPTION OF THE PREFERRED EMBODIMENT

Figure 6A:
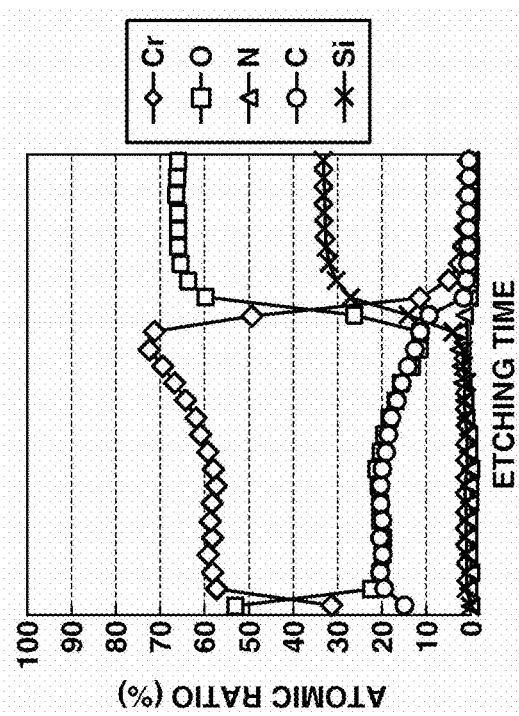
FIG. 6A is a graph showing a compositional distribution in the thickness direction of the chromium-containing film in Example 3.

The photomask blank of the invention is suitable used as a material for manufacturing a photomask that is used in pattern transfer conducted with exposure light having a wavelength of up to 250 nm, particularly up to 200 nm such as KrF excimer laser (248 nm) and ArF excimer laser (193 nm). I.e., the photomask blank is a material of a photomask that is used in pattern transfer with the exposure light.

The photomask blank of the invention includes a transparent substrate and a chromium-containing film. The chromium-containing film may be formed directly or via one of more of optical films on the transparent substrate. As the transparent substrate, there are no particular limitations on the type of the substrate and the size of the substrate. However, a transparent substrate such as a quartz substrate which is transparent at a wavelength used as an exposure wavelength is applied, and for example, a so called 6025 substrate having a size of 6 inch square and a thickness of 0.25 inch which is prescribed in the SEMI standard is preferable. In a case where the SI unit system is used, the 6025 substrate is generally represented as a substrate having a size of 152 mm square and a thickness of 6.35 mm.

The chromium-containing film is composed of a material etchable by oxygen-containing chlorine-based dry etching (dry etching by using a dry etching gas containing oxygen gas and chlorine gas) and is composed of a chromium compound containing chromium, oxygen and carbon. The chromium compound composing the chromium-containing film may contain nitrogen other than chromium, oxygen and carbon in the whole of the chromium-containing film, and may further contain a light element such as hydrogen and a halogen, and/or argon. Concrete examples of the chromium compound include chromium oxycarbide (CrOC), chromium oxycarbide nitride (CrOCN), and so on.

The chromium-containing film may have the following three embodiments (i) to (iii):

(i) only a region (A) composed of a chromium compound containing chromium, oxygen and carbon, wherein each of contents of the elements contained in the chromium compound is continuously varied in the thickness direction of the region (A), and toward the substrate, the content of chromium increases, and the content of carbon decreases;

(ii) the region (A), and a region (B) composed of a chromium compound containing chromium, oxygen and carbon, and contiguous to either the substrate side or the side remote from the substrate, wherein each of contents of the elements contained in the chromium compound is constant in the thickness direction of the region (B); or (iii) the region (A) or the regions (A) and (B), and a region (C) composed of a chromium compound containing chromium, oxygen and carbon, and disposed at the side remotest from the substrate, wherein each of contents of the elements contained in the chromium compound is continuously varied in the thickness direction of the region (C), and toward the substrate, the content of oxygen decreases.

The shape of the pattern and space in dry etching can be considered as follows. When dry etching is conducted, in principle, even if the film quality is uniform, a trapezoid shape is formed with a space width which is narrow at the transparent substrate side. This is because when etching is conducted by using a pattern of a resist film as an etching mask, the pattern of the resist film is also etched slowly, and the space width gradually increases. Further, even if a film such as a hard mask film that is hard to be etch in compared with a resist film is used as an etching mask, side etching proceeds according to an etching time, thus, the space width becomes narrow toward the transparent substrate side.

However, in actual etching, an etching rate in the direction perpendicular to the substrate surface (surface on which the film is formed) of the transparent substrate or in the direction of thickness of a film to be etched does not necessarily correspond to an etching rate in the horizontal direction parallel to the substrate surface of the transparent substrate or in the direction of the film surface of a film to be etched. Particularly, in the portion in contact with a resist film or a hard mask film, typically in the portion in contact with a hard mask film, an amount of etchant contributing to the etching in the perpendicular direction is much than an amount of etchant contributing to the etching in the horizontal direction, thus, side etching amount is reduced. This tendency becomes more remarkable at a position where closes to the resist film or the hard mask film. Therefore, in such a case, a cross-sectional shape of a film pattern obtained after etching is not a simple trapezoidal shape but a shape constricted at a central portion and its vicinity along the film thickness direction.

Accordingly, it is effective to construct a film to be etched at a position that contact to a resist film or a hard mask film so that the ratio of the etching rate in the direction perpendicular to the substrate surface of the transparent substrate to the etching rate in the horizontal direction parallel to the substrate surface of the transparent substrate becomes large toward closer to the resist film or hard mask film.

In the invention, in case that the pattern of the chromium-containing film is formed by using a dry etching, particularly a dry etching in which bias voltage is applied to an object substrate (photomask blank) to be subjected to the dry etching, when a chromium-containing film is configured as in the above-described embodiment (1), (2), or (3), a cross-sectional shape of a pattern of the chromium-containing film can be formed more perpendicularly.

The chromium compound composing each of the regions (A) to (C) may contain nitrogen other than chromium, oxygen and carbon, and may further contain a light element such as hydrogen and a halogen, and/or argon. Concrete examples of the chromium compound include chromium oxycarbide (CrOC), chromium oxycarbide nitride (CrOCN), and so on.

In the region (A), a difference between the maximum chromium content (at %) and the minimum chromium content (at %) is preferably at least 3. The upper limit of the difference of chromium content is normally up to 25, and preferably up to 20. In the region (A), a difference between the maximum carbon content (at %) and the minimum carbon content (at %) is preferably at least 5, more preferably at least 7. The upper limit of the difference of carbon content is normally up to 25, and preferably up to 20.

The chromium content of the region (A) is preferably at least 45 at %, more preferably at least 55 at %, at the lowest position, and preferably up to 80 at %, more preferably up to 75 at %, at the highest position. The oxygen content of the region (A) is preferably at least 7 at %, more preferably at least 10 at %, at the lowest position, and preferably up to 40 at %, more preferably up to 35 at %, at the highest position. The carbon content of the region (A) is preferably at least 1 at %, more preferably at least 3 at %, at the lowest position, and preferably up to 25 at %, more preferably up to 22 at %, at the highest position. The chromium compound composing the region (A) may further contain nitrogen. When the chromium compound composing the region (A) contains nitrogen, preferably, nitrogen content is continuously varied in the thickness direction, and nitrogen content increases toward the substrate. In this case, a difference between the maximum nitrogen content (at %) and the minimum chromium content (at %) is preferably at least 1, more preferably at least 2. The upper limit of the difference of nitrogen content is normally up to 20, and preferably up to 15. The nitrogen content of the region (A) is preferably at least 1 at % at the lowest position, and preferably up to 25 at % at the highest position, and the nitrogen content is preferably up to 10 at %, more preferably up to 5 at %, at the highest position, when specifically reduced side etching is required.

The region (A) has a thickness of preferably at least 30%, more preferably at least 50%, further preferably at least 70%, of the whole of the chromium-containing film.

The region (B) may formed on either or both of the substrate side of the region (A) and the side remote from the substrate of the region (A), however, the region (B) is preferably formed on only the side remote from the substrate.

The chromium content of the region (B) is preferably at least 45 at %, more preferably at least 50 at %, and preferably up to 70 at %, more preferably up to 65 at %. The oxygen content of the region (B) is preferably at least 10 at %, more preferably at least 15 at %, and preferably up to 30 at %, more preferably up to 25 at %. The carbon content of the region (B) is preferably at least 10 at %, more preferably at least 15 at %, and preferably up to 30 at %, more preferably up to 25 at %. The chromium compound composing the region (B) may further contain nitrogen. When the chromium compound composing the region (B) contains nitrogen, the nitrogen content of the region (B) is preferably at least 1 at %, more preferably at least 2 at %, and preferably up to 25 at %, and the nitrogen content is preferably up to 10 at %, more preferably up to 5 at %, when specifically reduced side etching is required.

A thickness of the region (B) (if the region (B) is formed on both of the substrate side of the region (A) and the side remote from the substrate of the region (A), the total thickness of the regions (B)) corresponds to the remainder of the chromium-containing film other than the region (A) in case of the chromium-containing film not including the region (C), or the remainder of the chromium-containing film other than the regions (A) and (C) in case of the chromium-containing film including the region (C).

The region (C) may be a region formed by oxidizing surface portion of the chromium-containing film at the side remote from the substrate by natural oxidation, heat treatment, cleaning, and so on. In the region (C), a difference between the maximum oxygen content (at %) and the minimum oxygen content (at %) is preferably at least 10, more preferably at least 15. The upper limit of the difference of oxygen content is normally up to 50, and preferably up to 45.

The chromium content of the region (C) is preferably at least 25 at %, more preferably at least 30 at %, at the lowest position, and preferably up to 80 at %, more preferably up to 75 at %, at the highest position. The oxygen content of the region (C) is preferably at least 5 at %, more preferably at least 10 at %, at the lowest position, and preferably up to 40 at %, more preferably up to 35 at %, at the highest position. The carbon content of the region (C) is preferably at least 1 at %, more preferably at least 2 at %, at the lowest position, and preferably up to 30 at %, more preferably up to 25 at %, at the highest position. The chromium compound composing the region (C) may further contain nitrogen. In this case, the nitrogen content of the region (C) is preferably at least 1 at %, more preferably at least 2 at %, at the lowest position, and preferably up to 20 at % at the highest position, and the nitrogen content is preferably up to 10 at %, more preferably up to 5 at %, at the highest position, when specifically reduced side etching is required.

The region (C) has a thickness of preferably up to 30%, more preferably up to 10%, further preferably up to 8%, of the whole of the chromium-containing film. In particular, the thickness of the region (C) is preferably less than 5 nm, more preferably up to 4 nm, further preferably up to 3 nm.

The chromium-containing film has a thickness (whole thickness) of preferably up to 50 nm, more preferably up to 48 nm, and preferably at least 35 nm, more preferably at least 40 nm. The chromium-containing film has an optical density of preferably at least 1.5, more preferably at least 1.8 with respect to exposure light. The chromium-containing film has a sheet resistance of preferably up to 10,000Ω/□, more preferably up to 8,000Ω/□. Such a sheet resistance can prevent charge-up when a resist pattern is drawn by electron beam.

The chromium-containing film of the invention may has any function and may be, for example, an optical film such as a light-shielding film, an antireflection film and a phase shift film (e.g. a halftone phase shift film), or a process aid film such as a hard mask film (e.g. an etching mask film) and an etching stopper film. The optical film includes a processing aid film that functions as a hard mask film, an etching stopper film, and so on, as long as the film is left on a photomask after processed and functions as an optical film. In addition, in the invention, an etching stopper film after processed is generally left in a photomask, and a hard mask film after processed may be left in a photomask or may be a so-called sacrificial film that will be completely removed from a photomask.

When the chromium-containing film is a film having an optical function such as a light-shielding film, or a hard optical mask film, high resolution and high pattern transferring accuracy are required along with the optical function. From the chromium-containing film of the invention, a mask pattern that satisfies an optical function such as optical density, and has a high etching rate in oxygen-containing chlorine-based dry etching, and an excellent cross-sectional shape with less line width variation in the thickness direction can be obtained.

The photomask blank of the invention is suitable for a photomask blank in which the chromium-containing film is patterned by oxygen-containing chlorine-based dry etching with a mask pattern of a photoresist film such as a chemically amplified resist, as an etching mask, in a photomask processing step.

For Example, a photomask blank (first embodiment) in which the chromium-containing film is directly formed on a transparent substrate is exemplified as the inventive photomask. FIG. 1 shows a cross-sectional view illustrating an example of a first embodiment of the photomask blank of the invention. The photomask blank 101 includes a transparent substrate 1, and a chromium-containing film 2 formed thereon. When the photomask blank 101 is processed to a photomask, generally, an electron beam resist film is formed on the chromium-containing film 2, followed by electron beam drawing. The photomask blank of the first embodiment may be a binary mask blank, and in this case, the chromium-containing film is preferably a light-shielding film.

In case that the chromium-containing film of the photomask blank of the first embodiment is a light-shielding film, the chromium-containing film has an optical density of preferably at least 2.5, more preferably at least 2.8, and preferably up to 3.5, more preferably up to 3.2, with respect to exposure light. In case that the chromium-containing film of the photomask blank of the first embodiment is a light-shielding film, the chromium-containing film has a thickness of preferably up to 75 nm, more preferably up to 70 nm, further preferably up to 65 nm, and preferably at least 50 nm, when exposure light is ArF excimer laser, or a thickness of preferably up to 90 nm, more preferably up to 80 nm, further preferably up to 75 nm, and preferably at least 55 nm, when exposure light is KrF excimer laser.

As a photomask blank in which the chromium-containing film is patterned by oxygen-containing chlorine-based dry etching with a mask pattern of a photoresist film such as a chemically amplified resist, as an etching mask, in a photomask processing step, a photomask blank (second embodiment) in which the chromium-containing film is formed via one of more of optical films on a transparent substrate is also preferable. Such a photomask blank is particularly advantageous, for example, since, when the pattern of the chromium-containing film functions as a hard mask in the etching of the optical film, a pattern with high accuracy can be formed from the chromium-containing film of the invention, and a pattern with high accuracy can also be formed from the optical film in patterning of the optical film by using a pattern of the chromium-containing film. In this case, examples of a combination of the chromium-containing film and the optical film include a combination of a light-shielding film and a phase shift film such as a halftone phase shift film, and a combination of a hard mask film and a light-shielding film.

FIG. 2 shows a cross-sectional view illustrating an example of a second embodiment of the photomask blank of the invention. The photomask blank 102 includes a transparent substrate 1, and an optical film 3 and a chromium-containing film 2 are laminated on the transparent substrate 1 sequentially from the transparent substrate side. When the photomask blank 102 is processed to a photomask, generally, an electron beam resist film is formed on the chromium-containing film 2, followed by electron beam drawing. The photomask blank of the second embodiment may be a phase shift mask blank, and in this case, the optical film and the chromium-containing film are preferably a phase shift film and a light-shielding film, respectively.

The photomask blank of the invention is suitable also for a photomask blank in which the chromium-containing film is patterned by oxygen-containing chlorine-based dry etching with a mask pattern of a hard mask film, as an etching mask, in a photomask processing step. For Example, a photomask blank (third embodiment) including a hard mask film formed on the chromium-containing film, in particular, on the side remote from the transparent substrate, preferably in contact with the chromium-containing film is exemplified as the inventive photomask.

FIG. 3 shows a cross-sectional view illustrating an example of a third embodiment of the photomask blank of the invention. The photomask blank 103 includes a transparent substrate 1, and an optical film 3, a chromium-containing film 2 and a hard mask film 3 are laminated on the transparent substrate 1 sequentially from the transparent substrate side. When the photomask blank 103 is processed to a photomask, generally, an electron beam resist film is formed on the hard mask film 3, followed by electron beam drawing. The photomask blank of the third embodiment may be a phase shift mask blank, and in this case, the optical film and the chromium-containing film are preferably a phase shift film and a light-shielding film, respectively.

As the photomask blank of the third embodiment, by providing a hard mask film as an etching mask for etching of the chromium-containing film, a photoresist film can be thinned, and the photomask blank can adopt to further miniaturization of a pattern. The hard mask film is usually used as a sacrificial film for a chromium-containing film, and in that case, the hard mask film is completely removed in the process of manufacturing a photomask, however, a part of the hard mask film may be left in a photomask without completely removing in the process of manufacturing a photomask.

When the chromium-containing film is formed via an optical film, which may be the same type of the chromium-containing film or a different type of the chromium-containing film, the chromium-containing film of the invention may has any function and may be, for example, an optical film such as a light-shielding film, an antireflection film and a phase shift film (e.g. a halftone phase shift film). The optical film includes a processing aid film that functions as a hard mask film, an etching stopper film, and so on, as long as the film is left on a photomask after processed and functions as an optical film.

As a material for the optical film formed between the transparent substrate and the chromium-containing film, a material such as a transition metal such as chromium (Cr), zirconium (Zr), tantalum (Ta), titanium (Ti), molybdenum (Mo), tungsten (W), iron (Fe), nickel (Ni) and cobalt (Co), a metal such as silicon (Si), germanium (Ge) and aluminum (Al), alloys of the metal, compounds such as oxides, nitrides, carbides oxynitrides, oxycarbides, nitride carbides, an oxynitride carbides of the metal or the alloy is used according to the required optical characteristics and etching characteristics, and further according to electrical characteristics such as a conductivity. Among the metals, chromium (Cr), molybdenum (Mo) and silicon (Si) are preferably used.

In case that the optical film of the photomask blank of the second embodiment is a phase shift film such as a halftone phase shift film, the phase shift film is composed of preferably a material containing silicon and free of a transition metal, or a material containing silicon and a transition metal which is preferably other than chromium, and particularly a material containing silicon and molybdenum. As preferable materials include a silicon simple substance, and a compound containing silicon and a light element such as oxygen, nitrogen, carbon, and so on, particularly either or both of oxygen and nitrogen. Further a compound of the material with adding a transition metal which is preferably other than chromium, for example, molybdenum, tantalum, tungsten, zirconium or titanium, typically molybdenum is also used as the preferable materials. In particular, when the phase shift film is a halftone phase shift film, the chromium-containing film can be thinner in compared with a photomask blank without using a halftone phase shift film since the halftone phase shift film also has an optical density.

In case that the chromium-containing film and the optical film of the photomask blank of the second embodiment is a light-shielding film and a halftone phase shift film, respectively, the chromium-containing film has an optical density of preferably at least 1.5, more preferably at least 1.8, and preferably up to 2.6, more preferably up to 2.5, further preferably up to 2.4, with respect to exposure light. A total optical density of the chromium-containing film and the phase shift film is preferably at least 2.5, more preferably at least 2.8, and preferably up to 3.5, more preferably up to 3.2, with respect to exposure light. Such an optical density of the chromium-containing film and the phase shift film can provide a necessary light-shielding ability.

In case that the chromium-containing film and the optical film of the photomask blank of the second embodiment is a light-shielding film and a halftone phase shift film, respectively, the chromium-containing film has a thickness of preferably up to 60 nm, more preferably up to 50 nm, further preferably up to 47 nm, most preferably up to 44 nm, and preferably at least 35 nm, when exposure light is ArF excimer laser, or a thickness of preferably up to 80 nm, more preferably up to 70 nm, further preferably up to 65 nm, and preferably at least 50 nm, when exposure light is KrF excimer laser.

Meanwhile, the halftone phase shift film is set to have a transmittance of preferably at least 2%, more preferably at least 5%, further preferably at least 10%, most preferably at least 11%, and preferably up to 40%, more preferably up to 30%, further preferably up to 20%, with respect to exposure light. The halftone phase shift film has a thickness of preferably up to 80 nm, more preferably up to 70 nm, and preferably at least 50 nm, more preferably at least 60 nm, when exposure light is ArF excimer laser, or a thickness of preferably up to 110 nm, more preferably up to 100 nm, and preferably at least 70 nm, more preferably at least 80 nm, when exposure light is KrF excimer laser.

The photomask blank of the second embodiment may be, as another example, a binary mask blank. In this case, the optical film and the chromium-containing film may be a light-shielding film and a hard mask film, respectively.

A chromium-containing film is used in a photomask blank for manufacturing a photomask in which pattern transfer is conducted with exposure light having a wavelength of up to 250 nm. In this case, a chromium-containing film having a high metallic property is preferable for preparing a chromium-containing film having low resistivity and high conductivity. On the other hand, a chromium-containing film having a low metallic property is highly effective in adjusting optical characteristics and etching characteristics of the chromium-containing film. Further, a chromium-containing film having a low metallic property is effective in improving a transmittance. A chromium-containing film having a high metallic property is a film having high reflectivity, which may be disadvantageous in defect inspection of a photomask blank and a photomask, however, a chromium-containing film having a low metallic property is preferable for an antireflection film applied in such a case. In case that the optical film of the photomask blank of the second embodiment is a light-shielding film, the light-shielding film is composed of preferably a material containing silicon and free of a transition metal, or a material containing silicon and a transition metal which is preferably other than chromium, and particularly a material containing silicon and molybdenum. As preferably materials for the light-shielding film include the same materials exemplified as the materials for the phase shift film.

In case that the optical film of the photomask blank of the second embodiment is a light-shielding film, the light-shielding film is normally set to have an optical density of at least 2.5, and preferably at least 2.8, and up to 3.5, more preferably up to 3.2, with respect to exposure light. In this case, the light-shielding film has a thickness of preferably up to 80 nm, more preferably up to 70 nm, further preferably up to 65 nm, and preferably at least 50 nm, more preferably at least 55 nm, when exposure light is ArF excimer laser, or a thickness of preferably up to 100 nm, more preferably up to 90 nm, further preferably up to 80 nm, and preferably at least 55 nm, more preferably at least 60 nm, when exposure light is KrF excimer laser. Meanwhile, in case that the chromium-containing film is a hard mask film, the chromium-containing film has a thickness of preferably at least 3 nm, more preferably at least 5 nm, and preferably up to 20 nm, more preferably up to 10 nm.

On the other hand, for example, a material that is rapidly etched by fluorine-based dry etching and has an extremely low etching rate, i.e., a material that is not substantially etched in oxygen-containing chlorine-based dry etching is used as a material for the hard mask film of the third embodiment. Preferable materials include a material containing silicon, for example, a silicon simple substance, or a compound containing silicon and a light element such as oxygen, nitrogen, carbon, and so on. Further a compound of the material with adding a transition metal which is preferably other than chromium, preferably molybdenum, tantalum, tungsten, zirconium or titanium is also used as the preferable materials.

In case that the optical film of the photomask blank of the third embodiment is a phase shift film such as a halftone phase shift film, the phase shift film is composed of preferably a material containing silicon and free of a transition metal, or a material containing silicon and a transition metal which is preferably other than chromium, and particularly a material containing silicon and molybdenum. As preferably materials for the phase shift film include the same materials exemplified in the photomask blank of the second embodiment. In particular, when the phase shift film is a halftone phase shift film, the chromium-containing film can be thinner in compared with a photomask blank without using a halftone phase shift film since the halftone phase shift film also has an optical density.

In case that the chromium-containing film and the optical film of the photomask blank of the third embodiment is a light-shielding film and a phase shift film such as a halftone phase shift film, each of an optical density of the chromium-containing film with respect to exposure light, a total optical density of the chromium-containing film and the phase shift film with respect to exposure light, a thickness of the chromium-containing film, a transmittance of the halftone phase shift film, and a thickness of the halftone phase shift film is preferably the same range exemplified in the second embodiment.

Further, in case that the chromium-containing film and the optical film of the photomask blank of the third embodiment is a light-shielding film and a halftone phase shift film, respectively, and a part of the hard mask film will be left in a photomask without completely removing in a process of manufacturing the photomask, i.e., the hard mask film will be left in a photomask and functions as an optical film, a total optical density of the chromium-containing film, the phase shift film and the hard mask film is preferably at least 2.5, more preferably at least 2.8, and preferably up to 3.5, more preferably up to 3.2, with respect to exposure light. Meanwhile, the hard mask film has a thickness of preferably at least 3 nm, more preferably at least 5 nm, and preferably up to 20 nm, more preferably up to 10 nm.

In addition, the photomask blank of the invention may be a photomask blank in which another optical film is formed on the side remote from the transparent substrate of the chromium-containing film, preferably in contact with the chromium-containing film. For example, a light-shielding film composed of a material containing silicon and free of a transition metal, or a material containing a transition metal and silicon is preferable as this optical film. When this light-shielding film is formed, the chromium-containing films can be functioned as an etching stopper film or a phase shift film such as a halftone phase shift film.

The chromium-containing film, the optical film, and the processing aid film of the photomask blank of the invention are preferably formed by sputtering that can provide a film having high in-plane uniformity of optical characteristics and having reduced defects.

When a chromium-containing film is formed, the sputtering may be conducted by, for example, using, as a target, a chromium target, and as a sputtering gas, a reactive gas that is selected from oxygen gas ($O_2$), carbon oxide gas (CO, $CO_2$), hydrocarbon gas (e.g. $CH_4$), nitrogen gas ($N_2$) and nitrogen oxide gas ($N_2O$, $NO_2$) and is selected according to the desired constituent element, and optionally using a rare gas such as argon gas along with the reactive gas. The sputtering may be conducted by supplying the sputtering gas into a sputtering vacuum vessel (a sputtering chamber), and adjusting a power applied to the target, and a feed amount of the sputtering gas so that the chromium-containing film has a prescribed inclined or constant composition, and optionally changing the power and/or the feed amount.

On the other hand, when a phase shift film or a light-shielding film composed of a material containing silicon and free of a transition metal or a material containing a transition metal and silicon is formed, the sputtering may be conducted by, for example, using, as a target, a target that is selected from silicon target, a transition metal target and a transition silicon target and is selected according to the desired constituent element, and as a sputtering gas, a reactive gas that is selected from oxygen gas ($O_2$), nitrogen gas ($N_2$), nitrogen oxide gas ($N_2O$, $NO_2$), carbon oxide gas (CO, $CO_2$) and hydrocarbon gas (e.g. $CH_4$) and is selected according to the desired constituent element, and optionally using a rare gas such as argon gas along with the reactive gas. The sputtering may be conducted by supplying the sputtering gas into a sputtering vacuum vessel, and adjusting a power applied to the target, and a feed amount of the sputtering gas so that the chromium-containing film has a prescribed inclined or constant composition, and optionally changing the power and/or the feed amount.

From the photomask blank of the invention, a photomask can be manufactured according to a conventional method. For example, a resist film such as a chemically amplified type is formed on a photomask blank, a pattern is drawn on the resist film with electron beam. The resulting pattern of the resist film pattern is used as a first etching mask, and a photomask is obtained by sequentially etching a chromium-containing film, an optical film such as a phase shift film and a light-shielding film, a process aid film such as a hard mask film and an etching stopper film, and a transparent substrate, which are disposed below the first etching mask, to form a photomask pattern with a dry etching selected from oxygen-containing chlorine-based dry etching and fluorine-based dry etching, according to the material of the film. Therefore, when a photomask is manufactured from the photomask blank of the invention, the manufacturing includes the step of patterning the chromium-containing film by oxygen-containing chlorine-based dry etching. In addition, an organic conductive film may be formed on a resist film, whereby charge-up during electron beam drawing can be further controlled.

EXAMPLES

Examples of the invention are given below by way of illustration and not by way of limitation.

Example 1

First, a halftone phase shift film of SiN film (Si:N=47:53 (atomic ratio)) that has a phase shift of 177° and a transmittance of 19% (an optical density OD of 0.72), at a wavelength of 193 nm of ArF excimer laser, and a thickness of 60 nm was formed on a 6025 quartz substrate by sputtering in a DC sputtering apparatus. In this sputtering, a silicon target was used as a target, and argon gas and nitrogen gas were used as a sputtering gas. A discharge power was set to 2,000 W, and flow rates of argon gas and nitrogen gas were set to 15 sccm and 50 sccm, respectively.

Next, a chromium-containing film was formed on the halftone phase shift film by sputtering in a DC sputtering apparatus. In this sputtering, a chromium metal target was used as a target, and argon gas and carbon dioxide gas were used as a sputtering gas. A discharge power was set to 1,000 W and maintained in constant, a flow rate of argon gas was set to 10 sccm, and maintained in constant, and a flow rate of carbon dioxide was set to 5 sccm at the start of discharge, and increased with a constant increasing rate so as to reach to 15 sccm while 320 seconds, then discharge was terminated.

The chromium-containing film had a thickness of 44 nm. The composition of the chromium-containing film was analyzed in the thickness direction by an XPS. A region (C) that is a surface portion remote from the substrate of the chromium-containing film was formed by natural oxidization, and had a composition continuously varied in the thickness direction within about 1/10 of the whole of the thickness from the side remote from the substrate of Cr:O:C=40:50:10 (atomic ratio) to the substrate side of Cr:O:C=60:20:20 (atomic ratio). Further, a region (A) that is the remainder portion located at the substrate side apart from the region (C) was formed, and had a composition continuously varied in the thickness direction from the side remote from the substrate of Cr:O:C=60:20:20 (atomic ratio) to the interfacial surface in contact with the substrate of Cr:O:C=80:10:10 (atomic ratio). The results of the compositional analysis are shown in FIG. 4A. The chromium-containing film had a transmittance of 0.43% (an optical density OD of 2.37) at a wavelength of 193 nm, and thus, the total optical density OD of the halftone phase shift film and the chromium-containing film was 3.09.

Next, a $SiO_2$ film having a thickness of 10 nm, as a hard mask film, was formed on the halftone phase shift film by sputtering in a DC sputtering apparatus. In this sputtering, a silicon target was used as a target, and argon gas and oxygen gas were used as a sputtering gas. A discharge power was set to 1,000 W, and flow rates of argon gas and oxygen gas were set to 15 sccm and 50 sccm, respectively. Accordingly, a photomask blank (halftone phase shift mask blank) was obtained.

The resulting photomask blank was patterned as follows to manufacture a photomask. First, a chemically amplified negative photoresist for electron beam was applied on the hard mask film, electron beam drawing and development were conducted to form a resist film pattern with a line width of 200 nm, and the hard mask film was etched with the resist film pattern as an etching mask by dry etching using a fluorine-based gas to form a hard mask film pattern.

Next, the resist film pattern remaining on the hard mask film pattern was removed by washing using an aqueous solution of sulfuric acid/hydrogen peroxide, then the chromium-containing film was etched by using the hard mask film pattern as an etching mask by dry etching using chlorine gas and oxygen gas to form a chromium-containing film pattern. From the cross-sectional observation of the pattern by a SEM, it was confirmed that the angle of the obtained chromium-containing film with respect to the surface (horizontal plane) in contact with the halftone phase shift film was about 80°. A cross-sectional image of the chromium-containing film pattern is shown in FIG. 4B.

Next, the halftone phase shift film was etched by using the chromium-containing film pattern as an etching mask by dry etching using a fluorine-based gas to form a halftone phase shift film pattern with simultaneously removing the hard mask film pattern on the chromium-containing film pattern.

Next, a chemically amplified negative photoresist for electron beam was applied, electron beam drawing and development were conducted to form a resist film pattern so that a portion from which the chromium-containing film pattern will be removed is exposed, and the predetermined portion of the chromium-containing film pattern was removed by dry etching using chlorine gas and oxygen gas. Accordingly, a photomask (halftone phase shift mask) was obtained.

It was found that by considering an etching bias from the pattern dimension of the resist film, since the side wall of the chromium-containing film pattern used as the hard mask was almost perpendicular, the pattern size of the halftone phase shift film formed from the obtained halftone phase shift mask blank had little deviation from the design dimension, and a halftone phase shift mask having high in-plane uniformity can be obtained.

Example 2

First, a halftone phase shift film of SiN film (Si:N=47:53 (atomic ratio)) that has a phase shift of 177° and a transmittance of 19% (an optical density OD of 0.72), at a wavelength of 193 nm of ArF excimer laser, and a thickness of 60 nm was formed on a 6025 quartz substrate by sputtering in a DC sputtering apparatus. In this sputtering, a silicon target was used as a target, and argon gas and nitrogen gas were used as a sputtering gas. A discharge power was set to 2,000 W, and flow rates of argon gas and nitrogen gas were set to 15 sccm and 50 sccm, respectively.

Next, a chromium-containing film was formed on the halftone phase shift film by sputtering in a DC sputtering apparatus. In this sputtering, a chromium metal target was used as a target, and argon gas and carbon dioxide gas were used as a sputtering gas. A discharge power was set to 1,000 W and maintained in constant, a flow rate of argon gas was set to 10 sccm, and maintained in constant, and a flow rate of carbon dioxide was set to 5 sccm at the start of discharge, increased with a constant increasing rate so as to reach to 15 sccm while 174 seconds, and further maintained in constant at 15 sccm for 174 seconds, then discharge was terminated.

The chromium-containing film had a thickness of 45 nm. The composition of the chromium-containing film was analyzed in the thickness direction by an XPS. A region (C) that is a surface portion remote from the substrate of the chromium-containing film was formed by natural oxidization, and had a composition continuously varied in the thickness direction within about 1/10 of the whole of the thickness from the side remote from the substrate of Cr:O:C=40:50:10 (atomic ratio) to the substrate side of Cr:O:C=60:20:20

(atomic ratio). Further, a region (B) that is located at the substrate side apart from the region (C) was formed, and had a constant composition of Cr:O:C=60:20:20 (atomic ratio) in the thickness direction within about 5/10 of the whole of the thickness, and a region (A) that is the remainder portion located at the substrate side apart from the region (B) was formed, and had a composition continuously varied in the thickness direction from the side remote from the substrate of Cr:O:C=60:20:20 (atomic ratio) to the interfacial surface in contact with to the substrate of Cr:O:C=80:10:10 (atomic ratio). The results of the compositional analysis are shown in FIG. 5A. The chromium-containing film had a transmittance of 0.42% (an optical density OD of 2.38) at a wavelength of 193 nm, and thus, the total optical density OD of the halftone phase shift film and the chromium-containing film was 3.10.

Next, a $SiO_2$ film having a thickness of 10 nm, as a hard mask film, was formed on the halftone phase shift film by sputtering in a DC sputtering apparatus. In this sputtering, a silicon target was used as a target, and argon gas and oxygen gas were used as a sputtering gas. A discharge power was set to 1,000 W, and flow rates of argon gas and oxygen gas were set to 15 sccm and 50 sccm, respectively. Accordingly, a photomask blank (halftone phase shift mask blank) was obtained.

The resulting photomask blank was patterned as follows to manufacture a photomask. First, a chemically amplified negative photoresist for electron beam was applied on the hard mask film, electron beam drawing and development were conducted to form a resist film pattern with a line width of 200 nm, and the hard mask film was etched with the resist film pattern as an etching mask by dry etching using a fluorine-based gas to form a hard mask film pattern.

Next, the resist film pattern remaining on the hard mask film pattern was removed by washing using an aqueous solution of sulfuric acid/hydrogen peroxide, then the chromium-containing film was etched by using the hard mask film pattern as an etching mask by dry etching using chlorine gas and oxygen gas to form a chromium-containing film pattern. From the cross-sectional observation of the pattern by a SEM, it was confirmed that the angle of the obtained chromium-containing film with respect to the surface (horizontal plane) in contact with the halftone phase shift film was about 82°. A cross-sectional image of the chromium-containing film pattern is shown in FIG. 5B.

Next, the halftone phase shift film was etched by using the chromium-containing film pattern as an etching mask by dry etching using a fluorine-based gas to form a halftone phase shift film pattern with simultaneously removing the hard mask film pattern on the chromium-containing film pattern.

Next, a chemically amplified negative photoresist for electron beam was applied, electron beam drawing and development were conducted to form a resist film pattern so that a portion from which the chromium-containing film pattern will be removed is exposed, and the predetermined portion of the chromium-containing film pattern was removed by dry etching using chlorine gas and oxygen gas. Accordingly, a photomask (halftone phase shift mask) was obtained.

It was found that by considering an etching bias from the pattern dimension of the resist film, since the side wall of the chromium-containing film pattern used as the hard mask was almost perpendicular, the pattern size of the halftone phase shift film formed from the obtained halftone phase shift mask blank had little deviation from the design dimension, and a halftone phase shift mask having high in-plane uniformity can be obtained.

Example 3

First, a halftone phase shift film of SiN film (Si:N=47:53 (atomic ratio)) that has a phase shift of 177° and a transmittance of 19% (an optical density OD of 0.72), at a wavelength of 193 nm of ArF excimer laser, and a thickness of 60 nm was formed on a 6025 quartz substrate by sputtering in a DC sputtering apparatus. In this sputtering, a silicon target was used as a target, and argon gas and nitrogen gas were used as a sputtering gas. A discharge power was set to 2,000 W, and flow rates of argon gas and nitrogen gas were set to 15 sccm and 50 sccm, respectively.

Next, a chromium-containing film was formed on the halftone phase shift film by sputtering in a DC sputtering apparatus. In this sputtering, a chromium metal target was used as a target, and argon gas, nitrogen gas and carbon dioxide gas were used as a sputtering gas. A discharge power was set to 1,000 W and maintained in constant, a flow rate of argon gas was set to 10 sccm, and maintained in constant, flow rates of nitrogen gas and carbon dioxide gas were set to 2 sccm and 5 sccm, respectively, at the start of discharge, the flow rate of nitrogen gas was decreased with a constant decreasing rate so as to reach to 0 sccm while 174 seconds, the flow rate of carbon dioxide gas was increased with a constant increasing rate so as to reach to 15 sccm while 174 seconds, the flow rates of nitrogen gas and carbon dioxide gas were further maintained in constant at 0 sccm and 15 sccm, respectively, for 174 seconds, then discharge was terminated.

The chromium-containing film had a thickness of 46 nm. The composition of the chromium-containing film was analyzed in the thickness direction by an XPS. A region (C) that is a surface portion remote from the substrate of the chromium-containing film was formed by natural oxidization, and had a composition continuously varied in the thickness direction within about 1/10 of the whole of the thickness from the side remote from the substrate of Cr:O:C:N=40:50:10:0 (atomic ratio) to the substrate side of Cr:O:C:N=60:20:20:0 (atomic ratio). Further, a region (B) that is located at the substrate side apart from the region (C) was formed, and had a constant composition of Cr:O:C:N=60:20:20:0 (atomic ratio) in the thickness direction within about 5/10 of the whole of the thickness, and a region (A) that is the remainder portion located at the substrate side apart from the region (B) was formed, and had a composition continuously varied in the thickness direction from the side remote from the substrate of Cr:O:C:N=60:20:20:0 (atomic ratio) to the interfacial surface in contact with to the substrate of Cr:O:C:N=75:11:11:3 (atomic ratio). The results of the compositional analysis are shown in FIG. 6A. The chromium-containing film had a transmittance of 0.42% (an optical density OD of 2.38) at a wavelength of 193 nm, and thus, the total optical density OD of the halftone phase shift film and the chromium-containing film was 3.10.

Next, a $SiO_2$ film having a thickness of 10 nm, as a hard mask film, was formed on the halftone phase shift film by sputtering in a DC sputtering apparatus. In this sputtering, a silicon target was used as a target, and argon gas and oxygen gas were used as a sputtering gas. A discharge power was set to 1,000 W, and flow rates of argon gas and oxygen gas were set to 15 sccm and 50 sccm, respectively. Accordingly, a photomask blank (halftone phase shift mask blank) was obtained.

The resulting photomask blank was patterned as follows to manufacture a photomask. First, a chemically amplified negative photoresist for electron beam was applied on the hard mask film, electron beam drawing and development were conducted to form a resist film pattern with a line width of 200 nm, and the hard mask film was etched with the resist film pattern as an etching mask by dry etching using a fluorine-based gas to form a hard mask film pattern.

Figure 6B:
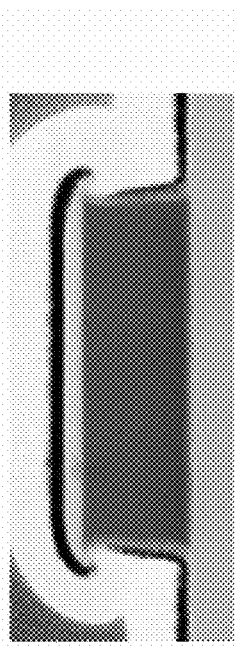
FIG. 6B is a scanning electron microscope image on the cross-section of the chromium-containing film pattern in Example 3.

Next, the resist film pattern remaining on the hard mask film pattern was removed by washing using an aqueous solution of sulfuric acid/hydrogen peroxide, then the chromium-containing film was etched by using the hard mask film pattern as an etching mask by dry etching using chlorine gas and oxygen gas to form a chromium-containing film pattern. From the cross-sectional observation of the pattern by a SEM, it was confirmed that the angle of the obtained chromium-containing film with respect to the surface (horizontal plane) in contact with the halftone phase shift film was about 86°. A cross-sectional image of the chromium-containing film pattern is shown in FIG. 6B.

Next, the halftone phase shift film was etched by using the chromium-containing film pattern as an etching mask by dry etching using a fluorine-based gas to form a halftone phase shift film pattern with simultaneously removing the hard mask film pattern on the chromium-containing film pattern.

Next, a chemically amplified negative photoresist for electron beam was applied, electron beam drawing and development were conducted to form a resist film pattern so that a portion from which the chromium-containing film pattern will be removed is exposed, and the predetermined portion of the chromium-containing film pattern was removed by dry etching using chlorine gas and oxygen gas. Accordingly, a photomask (halftone phase shift mask) was obtained.

It was found that by considering an etching bias from the pattern dimension of the resist film, since the side wall of the chromium-containing film pattern used as the hard mask was almost perpendicular, the pattern size of the halftone phase shift film formed from the obtained halftone phase shift mask blank had little deviation from the design dimension, and a halftone phase shift mask having high in-plane uniformity can be obtained.

Example 4

First, a halftone phase shift film of SiN film (Si:N=47:53 (atomic ratio)) that has a phase shift of 177° and a transmittance of 19% (an optical density OD of 0.72), at a wavelength of 193 nm of ArF excimer laser, and a thickness of 60 nm was formed on a 6025 quartz substrate by sputtering in a DC sputtering apparatus. In this sputtering, a silicon target was used as a target, and argon gas and nitrogen gas were used as a sputtering gas. A discharge power was set to 2,000 W, and flow rates of argon gas and nitrogen gas were set to 15 sccm and 50 sccm, respectively.

Next, a chromium-containing film was formed on the halftone phase shift film by sputtering in a DC sputtering apparatus. In this sputtering, a chromium metal target was used as a target, and argon gas, oxygen gas and carbon dioxide gas were used as a sputtering gas. A discharge power was set to 1,000 W and maintained in constant, a flow rate of argon gas was set to 10 sccm, and maintained in constant, flow rates of oxygen gas and carbon dioxide gas were set to 20 sccm and 0 sccm, respectively, at the start of discharge, the flow rate of nitrogen gas was decreased with a constant decreasing rate so as to reach to 0 sccm while 142 seconds, the flow rate of carbon dioxide gas was increased with a constant increasing rate so as to reach to 15 sccm while 142 seconds, the flow rates of oxygen gas and carbon dioxide gas were further maintained in constant at 0 sccm and 15 sccm, respectively, for 184 seconds, then discharge was terminated.

The chromium-containing film had a thickness of 48 nm. The composition of the chromium-containing film was analyzed in the thickness direction by an XPS. A region (C) that is a surface portion remote from the substrate of the chromium-containing film was formed by natural oxidization, and had a composition continuously varied in the thickness direction within about 1/10 of the whole of the thickness from the side remote from the substrate of Cr:O:C=40:50:10 (atomic ratio) to the substrate side of Cr:O:C=60:20:20 (atomic ratio). Further, a region (B) that is located at the substrate side apart from the region (C) was formed, and had a constant composition of Cr:O:C=60:20:20 (atomic ratio) in the thickness direction within about 6/10 of the whole of the thickness, and a region (A) that is the remainder portion located at the substrate side apart from the region (B) was formed, and had a composition continuously varied in the thickness direction from the side remote from the substrate of Cr:O:C=60:20:20 (atomic ratio) to the interfacial surface in contact with to the substrate of Cr:O:C=65:30:5 (atomic ratio). The results of the compositional analysis are shown in FIG. 7A. The chromium-containing film had a transmittance of 0.49% (an optical density OD of 2.31) at a wavelength of 193 nm, and thus, the total optical density OD of the halftone phase shift film and the chromium-containing film was 3.03.

Next, a $SiO_2$ film having a thickness of 10 nm, as a hard mask film, was formed on the halftone phase shift film by sputtering in a DC sputtering apparatus. In this sputtering, a silicon target was used as a target, and argon gas and oxygen gas were used as a sputtering gas. A discharge power was set to 1,000 W, and flow rates of argon gas and oxygen gas were set to 15 sccm and 50 sccm, respectively. Accordingly, a photomask blank (halftone phase shift mask blank) was obtained.

The resulting photomask blank was patterned as follows to manufacture a photomask. First, a chemically amplified negative photoresist for electron beam was applied on the hard mask film, electron beam drawing and development were conducted to form a resist film pattern with a line width of 200 nm, and the hard mask film was etched with the resist film pattern as an etching mask by dry etching using a fluorine-based gas to form a hard mask film pattern.

Next, the resist film pattern remaining on the hard mask film pattern was removed by washing using an aqueous solution of sulfuric acid/hydrogen peroxide, then the chromium-containing film was etched by using the hard mask film pattern as an etching mask by dry etching using chlorine gas and oxygen gas to form a chromium-containing film pattern. From the cross-sectional observation of the pattern by a SEM, it was confirmed that the angle of the obtained chromium-containing film with respect to the surface (horizontal plane) in contact with the halftone phase shift film was about 90°. A cross-sectional image of the chromium-containing film pattern is shown in FIG. 7B.

Next, the halftone phase shift film was etched by using the chromium-containing film pattern as an etching mask by dry etching using a fluorine-based gas to form a halftone phase shift film pattern with simultaneously removing the hard mask film pattern on the chromium-containing film pattern.

Next, a chemically amplified negative photoresist for electron beam was applied, electron beam drawing and development were conducted to form a resist film pattern so that a portion from which the chromium-containing film pattern will be removed is exposed, and the predetermined portion of the chromium-containing film pattern was removed by dry etching using chlorine gas and oxygen gas. Accordingly, a photomask (halftone phase shift mask) was obtained.

It was found that by considering an etching bias from the pattern dimension of the resist film, since the side wall of the chromium-containing film pattern used as the hard mask was almost perpendicular, the pattern size of the halftone phase shift film formed from the obtained halftone phase shift mask blank had little deviation from the design dimension, and a halftone phase shift mask having high in-plane uniformity can be obtained.

Comparative Example 1

First, a halftone phase shift film of SiN film (Si:N=47:53 (atomic ratio)) that has a phase shift of 177° and a transmittance of 19% (an optical density OD of 0.72), at a wavelength of 193 nm of ArF excimer laser, and a thickness of 60 nm was formed on a 6025 quartz substrate by sputtering in a DC sputtering apparatus. In this sputtering, a silicon target was used as a target, and argon gas and nitrogen gas were used as a sputtering gas. A discharge power was set to 2,000 W, and flow rates of argon gas and nitrogen gas were set to 15 sccm and 50 sccm, respectively.

Next, a chromium-containing film was formed on the halftone phase shift film by sputtering in a DC sputtering apparatus. In this sputtering, a chromium metal target was used as a target, and argon gas, nitrogen gas and carbon dioxide gas were used as a sputtering gas. A discharge power was set to 1,000 W and maintained in constant, a flow rate of argon gas was set to 10 sccm, and maintained in constant, flow rates of nitrogen gas and carbon dioxide gas were set to 8 sccm and 17 sccm, respectively, at the start of discharge, and maintained in the constant, after 190 seconds, the flow rates of nitrogen gas were changed to 0 sccm and 15 sccm, respectively, and further maintained in constant, for 184 seconds, then discharge was terminated.

Figure 8A:
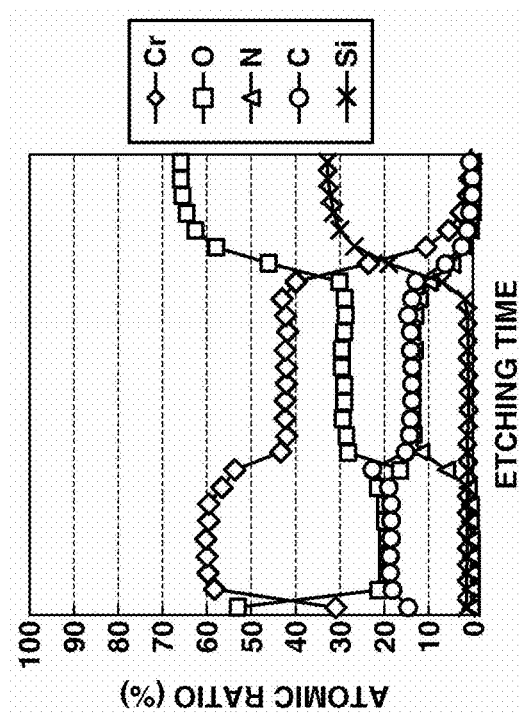
FIG. 8A is a graph showing a compositional distribution in the thickness direction of the chromium-containing film in Comparative Example 1.

The chromium-containing film had a thickness of 51 nm. The composition of the chromium-containing film was analyzed in the thickness direction by an XPS. A region (i) that is a surface portion remote from the substrate of the chromium-containing film was formed by natural oxidization, and had a composition continuously varied in the thickness direction within about $\frac{1}{10}$ of the whole of the thickness from the side remote from the substrate of Cr:O:C:N=40:50:10:0 (atomic ratio) to the substrate side of Cr:O:C:N=60:20:20:0 (atomic ratio). Further, a region (ii) that is located at the substrate side apart from the region (i) was formed, and had a constant composition of Cr:O:C:N=60:20:20:0 (atomic ratio) in the thickness direction within about $\frac{4}{10}$ of the whole of the thickness, and another region (iii) that is the remainder portion located at the substrate side apart from the region (ii) was formed, and had a constant composition of Cr:O:C:N=42:29:15:14 (atomic ratio) in the thickness direction. The composition was discontinuously varied from the region (ii) to the region (iii). The results of the compositional analysis are shown in FIG. 8A. The chromium-containing film had a transmittance of 0.45% (an optical density OD of 2.35) at a wavelength of 193 nm, and thus, the total optical density OD of the halftone phase shift film and the chromium-containing film was 3.07.

Next, a $SiO_2$ film having a thickness of 10 nm, as a hard mask film, was formed on the halftone phase shift film by sputtering in a DC sputtering apparatus. In this sputtering, a silicon target was used as a target, and argon gas and oxygen gas were used as a sputtering gas. A discharge power was set to 1,000 W, and flow rates of argon gas and oxygen gas were set to 15 sccm and 50 sccm, respectively. Accordingly, a photomask blank (halftone phase shift mask blank) was obtained.

The resulting photomask blank was patterned as follows to manufacture a photomask. First, a chemically amplified negative photoresist for electron beam was applied on the hard mask film, electron beam drawing and development were conducted to form a resist film pattern with a line width of 200 nm, and the hard mask film was etched with the resist film pattern as an etching mask by dry etching using a fluorine-based gas to form a hard mask film pattern.

Figure 8B:
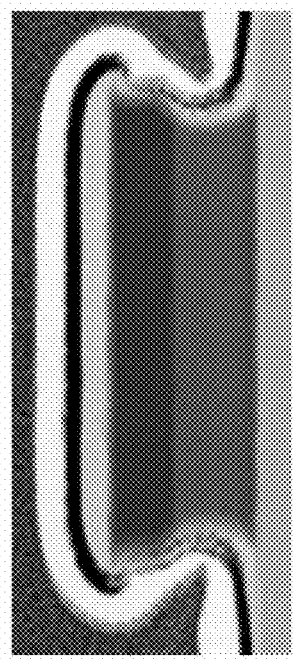
FIG. 8B is a scanning electron microscope image on the cross-section of the chromium-containing film pattern in Comparative Example 1.

Next, the resist film pattern remaining on the hard mask film pattern was removed by washing using an aqueous solution of sulfuric acid/hydrogen peroxide, then the chromium-containing film was etched by using the hard mask film pattern as an etching mask by dry etching using chlorine gas and oxygen gas to form a chromium-containing film pattern. From the cross-sectional observation of the pattern by a SEM, it was confirmed that the angle of the obtained chromium-containing film with respect to the surface (horizontal plane) in contact with the halftone phase shift film was more than 90°. Further, it was confirmed that the cross-sectional shape of the chromium-containing film pattern was narrow at the center of the pattern along the thickness direction, and an undercut shape with large side etching. A cross-sectional image of the chromium-containing film pattern is shown in FIG. 8B.

Next, the halftone phase shift film was etched by using the chromium-containing film pattern as an etching mask by dry etching using a fluorine-based gas to form a halftone phase shift film pattern with simultaneously removing the hard mask film pattern on the chromium-containing film pattern.

Next, a chemically amplified negative photoresist for electron beam was applied, electron beam drawing and development were conducted to form a resist film pattern so that a portion from which the chromium-containing film pattern will be removed is exposed, and the predetermined portion of the chromium-containing film pattern was removed by dry etching using chlorine gas and oxygen gas. Accordingly, a photomask (halftone phase shift mask) was obtained.

It was found that by considering an etching bias from the pattern dimension of the resist film, since the side wall of the chromium-containing film pattern used as the hard mask was formed a constriction shape, the pattern size of the halftone phase shift film formed from the obtained halftone phase shift mask blank was easy to deviate from the design dimension, and a halftone phase shift mask having high in-plane uniformity cannot be obtained.

Japanese Patent Application No. 2018-232298 is incorporated herein by reference. Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A photomask blank for a material of a photomask used in pattern transfer by exposure light having a wavelength of up to 250 nm, the photomask blank comprising a transparent substrate, and a chromium-containing film directly formed on the substrate or formed with an optical film intervened between the transparent substrate and the chromium-containing film, the chromium-containing film being susceptible to oxygen-containing chlorine-based dry etching, wherein the chromium-containing film consists of:

only a region (A) composed of a chromium compound containing chromium, oxygen and carbon, wherein each of contents of the elements contained in the chromium compound is continuously varied in the thickness direction of the region (A), and toward the substrate, the content of chromium increases, and the content of carbon decreases;

(ii) the region (A), and a region (B) composed of a chromium compound containing chromium, oxygen and carbon, and contiguous to either the substrate side or the side remote from the substrate, wherein each of contents of the elements contained in the chromium compound is constant in the thickness direction of the region (B); or (iii) the region (A) or the regions (A) and (B), and a region (C) composed of a chromium compound containing chromium, oxygen and carbon, and disposed at the side remotest from the substrate, wherein each of contents of the elements contained in the chromium compound is continuously varied in the thickness direction of the region (C), and toward the substrate, the content of oxygen decreases.

2. The photomask blank of claim 1, wherein in the region (A), a difference between the maximum and minimum chromium contents (at %) is at least 3, and in the region (A) or the regions (A) and (B), chromium content is at least 45 at %.

3. The photomask blank of claim 1, wherein in the region (A), a difference between the maximum and minimum carbon contents (at %) is at least 5.

4. The photomask blank of claim 1, wherein the chromium compound composing the region (A) further contains nitrogen, and toward the substrate, the content of nitrogen increases.

5. The photomask blank of claim 1, wherein the chromium-containing film has a thickness of up to 50 nm.

6. The photomask blank of claim 1, wherein the chromium-containing film has an optical density of at least 1.5 with respect to the exposure light.

7. The photomask blank of claim 1, wherein the chromium-containing film is formed with the optical film intervened between the transparent substrate and the chromium-containing film, and the optical film comprises a phase shift film composed of a material containing silicon and free of a transition metal, or a material containing a transition metal and silicon.

8. The photomask blank of claim 7, wherein the total optical density of the chromium-containing film and the phase shift film is at least 2.5.

9. The photomask blank of claim 1, comprising a hard mask film disposed on the chromium-containing film and composed of a material containing silicon.

10. A method of manufacturing a photomask comprising the step of patterning the chromium-containing film of the photomask blank of claim 1 by oxygen-containing chlorine-based dry etching.

* * * * *